(12) United States Patent
Liu

(10) Patent No.: US 7,205,854 B2
(45) Date of Patent: Apr. 17, 2007

(54) ON-CHIP TRANSISTOR DEGRADATION MONITORING

(75) Inventor: Jonathan H. Liu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 10/745,427

(22) Filed: Dec. 23, 2003

(65) Prior Publication Data

US 2005/0134394 A1    Jun. 23, 2005

(51) Int. Cl.
    *H03K 3/03*    (2006.01)
(52) U.S. Cl. .............................. 331/57; 324/763; 716/4
(58) Field of Classification Search ................... 331/57; 324/763, 764–769, 71.5, 71.1; 716/4
    See application file for complete search history.

(56) References Cited

U.S. PATENT DOCUMENTS

| | | | |
|---|---|---|---|
| 6,535,013 B2 | 3/2003 | Samaan | |
| 6,724,268 B2 * | 4/2004 | Takahashi | ..................... 331/57 |
| 6,903,564 B1 * | 6/2005 | Suzuki | ....................... 324/763 |
| 2005/0134394 A1 | 6/2005 | Liu | |
| 2005/0140418 A1 | 6/2005 | Munlandy et al. | |

OTHER PUBLICATIONS

U.S. Appl. No. 11/096,777, filed Mar. 31, 2005, Liu et al.

* cited by examiner

Primary Examiner—Michael B Shingleton
(74) Attorney, Agent, or Firm—Blakely, Sokoloff, Taylor & Zafman LLP

(57) ABSTRACT

Embodiments of the invention include on-chip characterization of transistor degradation. In one embodiment, includes one or more functional blocks to perform one or more functions and an integrated on-chip characterization circuit to perform on-chip characterization of transistor degradation. The integrated on-chip characterization circuit includes a selectively enabled ring oscillator to generate a reference oscillating signal, a free-running ring oscillator to generate a free-running oscillating signal, and a comparison circuit coupled to the selectively enabled ring oscillator and the free-running ring oscillator. From the reference oscillating signal and the free-running oscillating signal, the comparison circuit determine a measure of transistor degradation.

29 Claims, 8 Drawing Sheets

FIG. 1
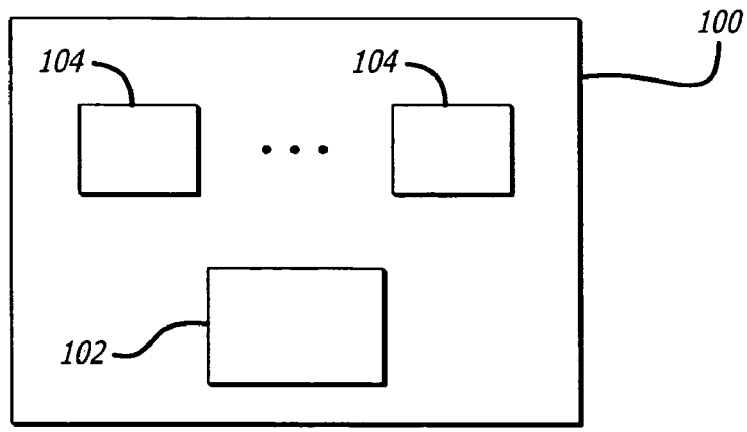
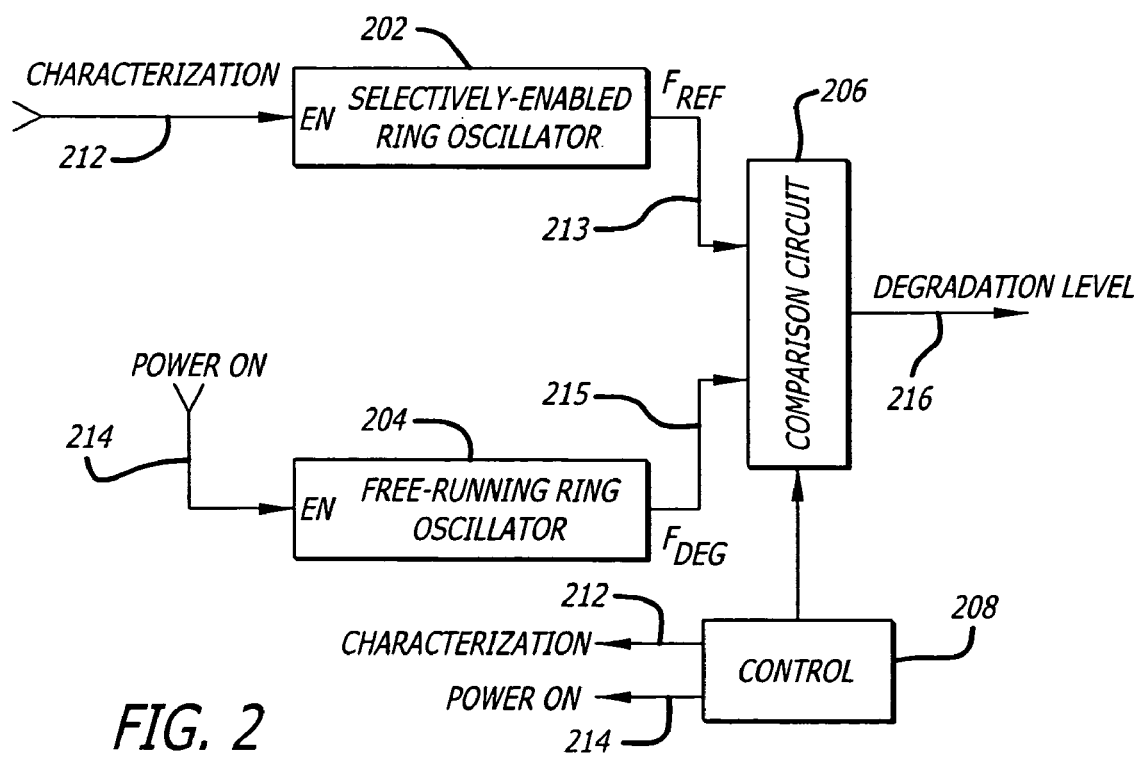
FIG. 2

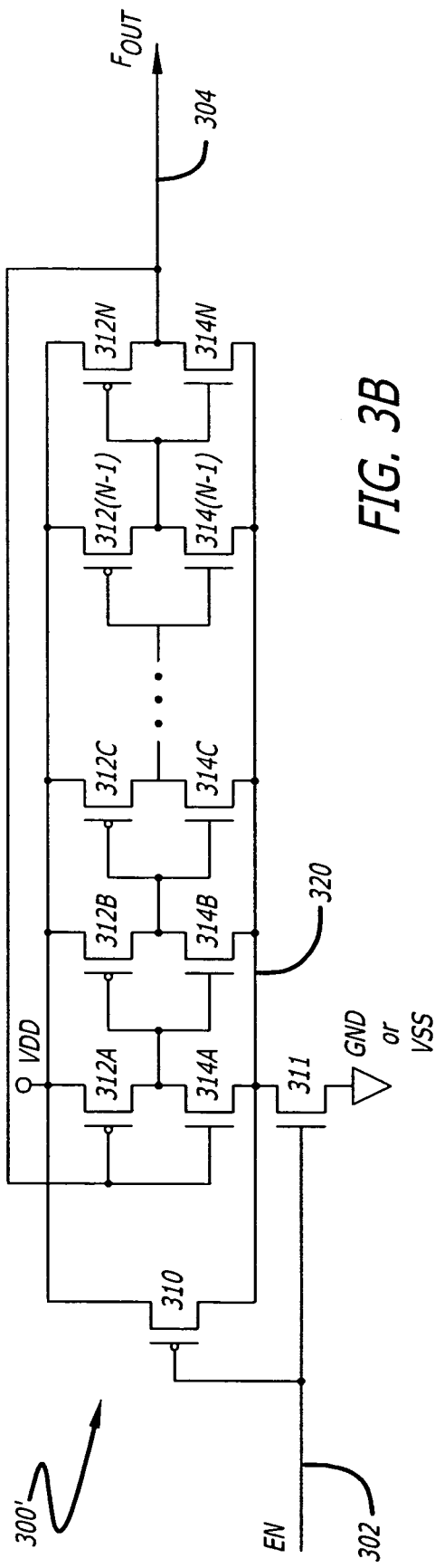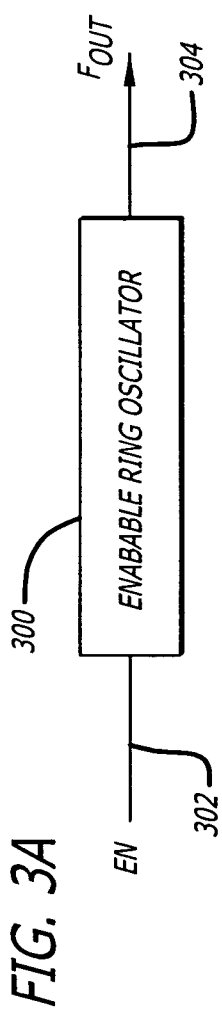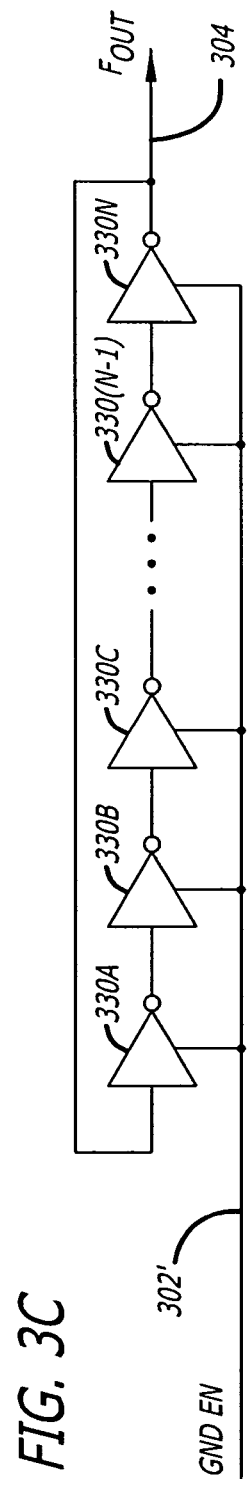
FIG. 3B
FIG. 3A
FIG. 3C

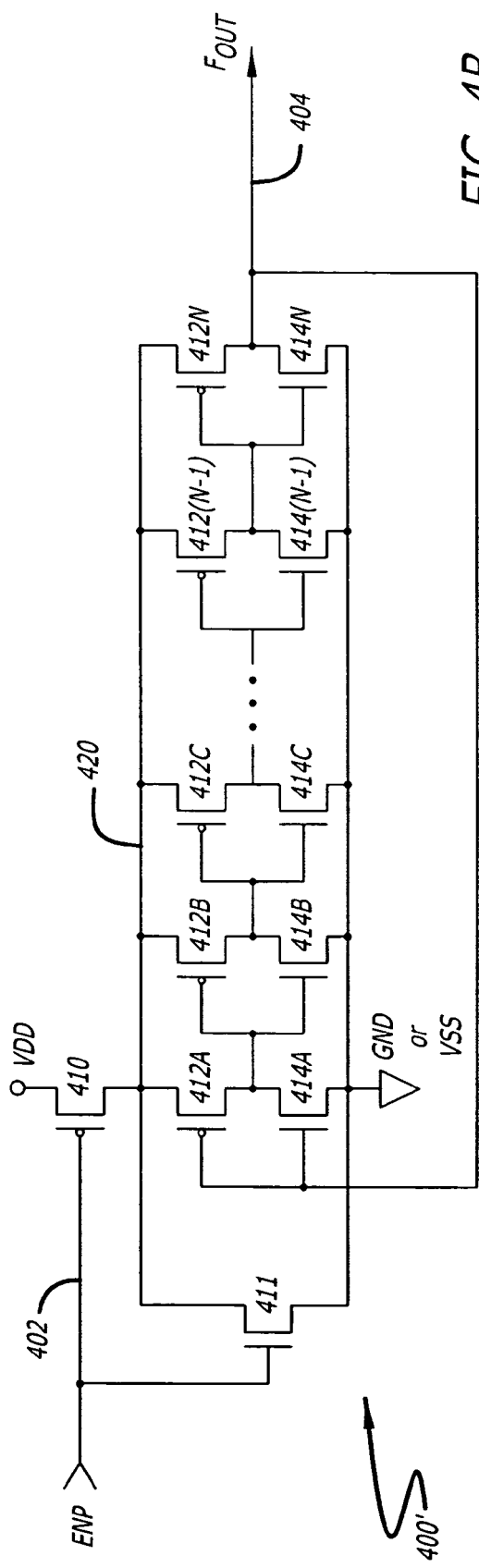
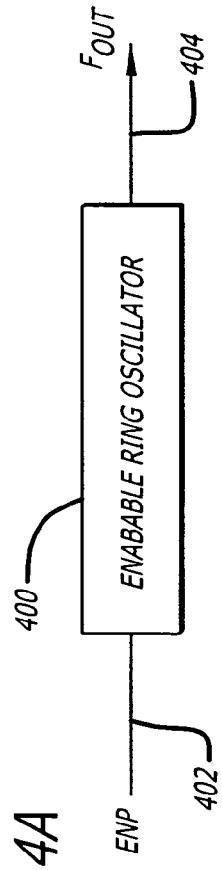
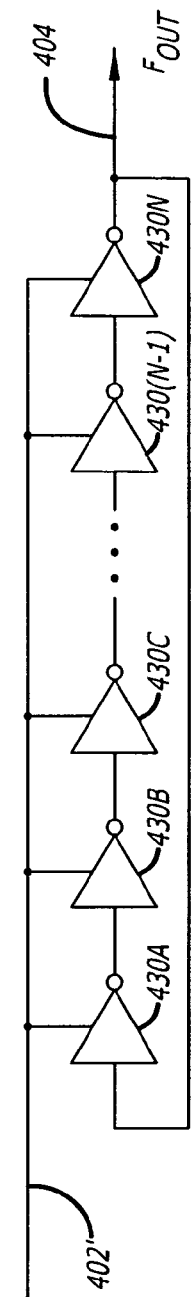
FIG. 4A
FIG. 4B
FIG. 4C

ON-CHIP TRANSISTOR DEGRADATION MONITORING

FIELD OF THE INVENTION

Embodiments of the invention relate generally to on-chip testing, and specifically to on-chip characterization of transistor degradation.

BACKGROUND OF THE INVENTION

As p-channel and n-channel field effect transistors in complementary metal oxide semiconductor integrated circuits have been scaled down, reliability problems with these transistors have increased.

In n-channel field effect transistors (NFETs) as the channel lengths have decreased, a transistor degradation sometimes referred to as a hot-electron effect has become a greater problem. The hot-electron effect has been studied for quite some time now. Power supplies were accordingly reduced as the transistors were scaled down in order to minimize the hot-electron effect. Designers can design around this somewhat by increasing the channel length of a transistor or increase signal slew rates. For example the channel lengths of certain transistors that may experience greater stress, such as output drivers, may be increased over that of the minimum channel lengths, in order to decrease the hot electron effect.

In the p-channel field effect transistors (PFETs), a new transistor degradation has more recently been discovered. This phenomenon is sometimes referred to as "negative bias temperature instability" (NBTI) but may more commonly be referred to as PMOS BT (p-channel metal oxide semiconductor field effect transistor ("PMOS") bias temperature) or PBT as it causes the turn on threshold (Vth) of the PFET to shift.

In order to ascertain whether integrated circuit designs and semiconductor process can overcome these transistor degrading effects, the integrated circuit was put through quality assurance and reliability testing.

Typical quality assurance and reliability testing for integrated circuits was to "burn-in" or run the functional device for extended periods of time in hot ovens at higher voltages and then test or characterize the functionality of the integrated circuit over the corners of the power supply, operating temperature, and clock speed to see if it would still function. However, "burn-in" is not actually how an integrated circuit is used in a system. The integrated circuit will experience other conditions such as power cycling, large temperature variations, and even physical vibration while in use.

In other cases, dedicated test integrated circuits are used to determine the quality assurance and the reliability of a given semiconductor process. These dedicated test integrated circuits that provide characterization information, have little to no functionality and are typically designed for experimental testing only. In order to obtain a measure of the quality assurance and the reliability, the dedicated test integrated circuit may be similarly "burned-in" and then tested or characterized over the corners of the power supply and operating temperature. In this case measurements are taken to try and determine the reliability and quality of a process and a design. But again, this is not actually how an integrated circuit is used in a system.

BRIEF DESCRIPTION OF THE DRAWINGS

FIG. 1 illustrates a block diagram of an integrated circuit including an integrated on-chip characterization block as one embodiment of the invention.

FIG. 2 illustrates a functional block diagram of the integrated on-chip characterization blocks to provide transistor degradation monitoring as one embodiment of the invention.

FIG. 3A illustrates a block diagram of an enabable ring oscillator that may be used in embodiments of the invention.

FIG. 3B illustrates a transistor schematic diagram of an embodiment of an enabable ring oscillator.

FIG. 3C illustrates a functional block diagram of the elements of the enabable ring oscillator of FIG. 3B.

FIG. 4A illustrates another block diagram of an enabable ring oscillator that may be used in embodiments of the invention.

FIG. 4B illustrates another transistor schematic diagram of an embodiment of an enabable ring oscillator.

FIG. 4C illustrates a functional block diagram of the elements of the enabable ring oscillator of FIG. 4B.

DETAILED DESCRIPTION

Figure 3D:
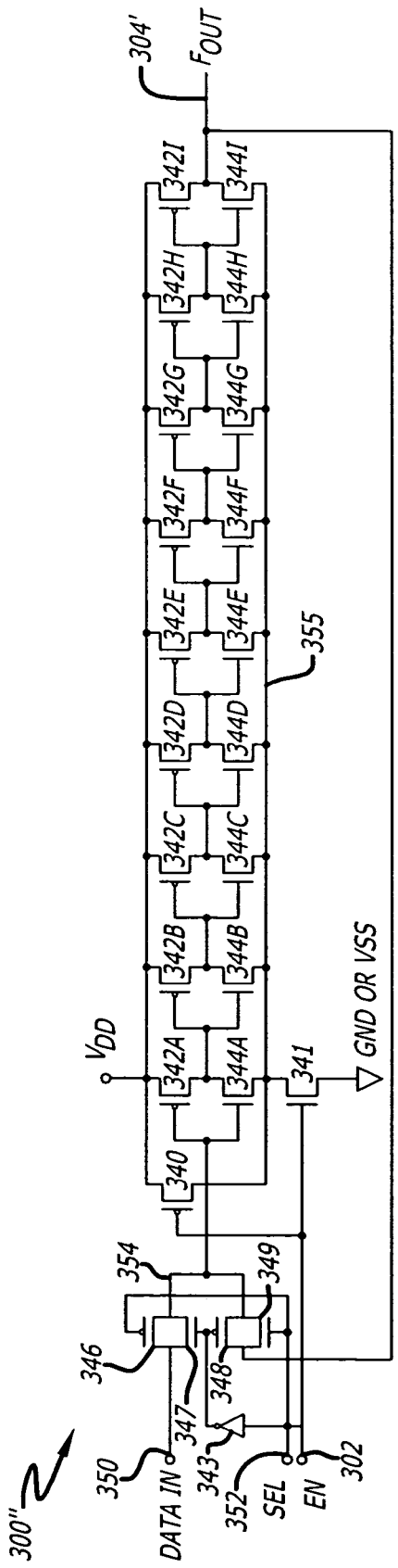
FIG. 3D illustrates another transistor schematic diagram of another embodiment of an enabable ring oscillator.

In the following detailed description of embodiments of the invention, numerous specific details are set forth in order to provide a thorough understanding of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

There are two known significant transistor degradation mechanisms that affect circuit performance. These significant transistor degradation mechanisms are PMOS BT transistor degradation and NMOS hot electron transistor degradation. An integrated on-chip characterization or monitoring circuit is used to quantify these two transistor degradation or aging effects. The on-chip characterization or monitoring circuit is integrated onto the same monolithic die or substrate as the functional blocks of the integrated circuit. In this manner, some circuits of the on-chip characterization or monitoring circuit experience the same stresses of the functional blocks within a system.

To separately quantify these two transistors aging effects, one or more pairs of ring oscillators or data paths are used to monitor the transistor degradation. One pair of the ring oscillators is designed to obtain the amount of PMOS BT transistor degradation. The other pair of the ring oscillators is designed to obtain the amount of NMOS hot electron transistor degradation in conjunction with PMOS BT transistor degradation. Subtraction of one value from the other is used to obtain the amount of NMOS hot electron transistor degradation. A single pair of ring oscillators may be used to obtain the amount of NMOS hot electron transistor degradation in conjunction with PMOS BT transistor degradation. In some cases, PMOS BT transistor degradation is the dominating transistor degradation mechanism so that NMOS hot electron transistor degradation can be ignored or estimated.

The levels of PMOS BT and hot electron transistor degradation determined by the on-chip characterization or monitoring circuit may be used to quantify maximum frequency (Fmax) clock degradation of an integrated circuit and the risks of special circuits found therein. The levels of PMOS BT and hot electron transistor degradation can also be used to calibrate aging parameters and models in various aging simulators to provide better correlation to the actual silicon when analyzing speed path aging and design fixes thereto.

Embodiments of the invention include methods and apparatuses to monitor or characterize amounts of transistor degradation, accumulated during the lifetime of a semiconductor device. Pairs of ring oscillators with substantially similar transistor networks or circuits are provided. One of the ring oscillators of the pairs is enabled when the integrated circuits are powered on so that it is under stress during the lifetime of the integrated circuit. The other one of the ring oscillators of the pairs is only enabled when a measure of the transistor degradation is taken, and otherwise, is "specially biased" so that it is not under stress during the lifetime of the integrated circuit.

These specially biased or selectively enabled ring oscillators provide a reference ring oscillation output to compare with a degraded or aged ring oscillation output. In these specially biased ring oscillators, the transistors will not degrade or age as they are disabled and unbiased during a substantial portion of their lifetimes. Thus, these specially biased ring oscillators provide a "fresh" reference output for each integrated circuit to which they are integrated on-chip.

Typical ring oscillators are almost always powered on with the integrated circuit, even thought they may not be oscillating. In which case they always degrade because PMOS BT transistor degradation happens if the PFET transistors are turned on, regardless whether there is current flowing through it. In a static powered on condition, every other PFET transistor is turned on in a typical ring oscillator and experience transistor degradation, even though the ring oscillator is not oscillating.

By comparing the output frequencies of the oscillating signals of each pair of identical ring oscillators (one continuously enabled to experience stress and the other substantially disabled to avoid stress), the frequency degradation of the stressed ring oscillators can be easily obtained in the embodiments of the invention. From this information, the amount of transistor degradation can be accurately derived. In one embodiment, the frequency skew between the stressed and unstressed ring oscillators is readily compared to determine the amount of transistor level device degradations (PMOS BT transistor degradation and NMOS hot electron transistor degradation).

Embodiments of the invention enable quantification of actual transistor degradation to the parameters of a functional integrated circuit, including the impact of transistor degradation to (a) the degradation of maximum frequency of an integrated circuit; (b) the use of maximum frequency reliability guard bands; (c) the design robustness of various special circuits; and (d) the monitoring of manufacturing process.

In one embodiment, an integrated circuit includes one or more functional blocks to perform one or more functions and an integrated on-chip characterization circuit. The integrated on-chip characterization circuit includes a selectively enabled or "fresh" ring oscillator to generate a reference oscillating signal, a free-running ring or pattern driven "aged" oscillator to generate a free-running oscillating signal, and a comparison circuit coupled to the selectively enabled ring oscillator and the aged ring oscillator, the comparison circuit to determine a measure of transistor degradation.

In another embodiment, a method in an integrated circuit with functional blocks is disclosed including generating a free-running oscillation signal to degrade transistors in a first ring oscillator; selectively generating a reference oscillation signal in a second ring oscillator; and comparing the free-running oscillation signal with the reference oscillation signal to characterize the transistor degradation in the transistors of the integrated circuit.

In yet another embodiment, another method in an integrated circuit with functional blocks is disclosed including generating a first degraded oscillation signal in a first short channel ring oscillator having transistors with short channel lengths; selectively generating a first reference oscillation signal in a second short channel ring oscillator having transistors with short channel lengths; comparing the first degraded oscillation signal with the first reference oscillation signal to measure the combined characteristic of PMOS bias temperature transistor degradation and hot electron transistor degradation in the transistors of the integrated circuit; generating a second degraded oscillation signal in a first long channel ring oscillator having transistors with long channel lengths; selectively generating a second reference oscillation signal in a second long channel ring oscillator having transistors with long channel lengths; and comparing the second degraded oscillation signal with the second reference oscillation signal to measure the characteristic of PMOS bias temperature transistor degradation with negligible hot electron transistor degradation in the long channel transistors of the integrated circuit.

In still another embodiment, a microprocessor integrated circuit is disclosed including an execution unit to execute instructions and an integrated on-chip characterization circuit. The integrated on-chip characterization circuit includes a first reference ring oscillator having transistors with short channels, a first degrading ring oscillator having transistors with short channels matching the first reference ring oscillator, a second reference ring oscillator having transistors with long channels, a second degrading ring oscillator having transistors with long channels matching the second reference ring oscillator, a multiplexer coupled to the first and second reference ring oscillators and the first and second degrading ring oscillators, and a measurement and comparison circuit coupled to the multiplexer.

The first reference ring oscillator selectively generates the first reference oscillating signal. The first degrading ring oscillator generates the first degrading oscillating signal. The second reference ring oscillator selectively generates the second reference oscillating signal. The second degrading ring oscillator generates the second degrading oscillating signal. The multiplexer selectively couples one or more of the first reference oscillating signal, the first degrading oscillating signal, the second reference oscillating signal, and the second degrading oscillating signal into the measurement and comparison circuit. The measurement and comparison circuit receives the first reference oscillating signal and the first degrading oscillating signal to generate a first measure of transistor degradation; and receives the second reference oscillating signal and the second degrading oscillating signal to generate a second measure of transistor degradation.

In another embodiment, a system is disclosed including a processor for executing instructions and processing data, and an integrated on-chip characterization circuit. Transistors of the processor experience transistor degradation over time as the processor ages. The integrated on-chip characterization circuit determines a measure of the transistor degradation in the transistors of the processor. The integrated on-chip characterization circuit includes at least one free-running ring oscillator to generate a free-running oscillating signal, at least one selectively enabled ring oscillator to generate a reference oscillating signal, and a comparison circuit coupled to the selectively enabled ring oscillator and the free-running ring oscillator. The comparison circuit determines the measure of transistor degradation in the transistors of the processor.

Referring now to FIG. 1, a monolithic integrated circuit chip 100 is illustrated as one embodiment of the invention. The integrated circuit 100 includes on-chip characterization circuitry 102 and one or more functional circuits 104. The on-chip characterization circuitry 102 includes transistor degradation monitors that may be used to calibrate aging parameters to correlate the actual silicon with simulation in order to perform better speed path aging analysis and develop fixes that are two. As discussed further below, the integrated circuit 100 may include one or more functional blocks, such as an execution unit for example, and in which case the integrated circuit maybe a microprocessor integrated circuit.

Referring now to FIG. 2, a functional block diagram of an embodiment of the invention is illustrated. The on-chip characterization circuitry 102 includes a selectively-enabled ring oscillator 202, a free-running ring oscillator 204, a comparison circuit 206, and a control circuit 208. Periodically, the integrated circuit 100 may cause the on-chip characterization circuitry 102 to measure transistor degradation. One or more degradation levels 216 may be generated by the comparison circuit 206.

The degradation levels 216 may be read out from the integrated circuit by a user system to adapt the user system to it in one embodiment. In another embodiment, the degradation levels 216 may be read out from the integrated circuit by a test or characterization system in order to obtain the degradation data and use it to better calibrate a model simulation of transistor degradation. In yet another embodiment, the degradation levels 216 may be used by the integrated circuit 100 internally in order to adapt to the aging or transistor degradation of its own transistors.

The selectively-enabled ring oscillator 202 and free-running ring oscillator 204 form a pair of ring oscillators (ROs) that may be used as a transistor degradation monitor to characterize transistor degradation. One or more pairs of ring oscillators (selectively-enabled ring oscillator 202 and free-running ring oscillator 204) may be used to characterize various types of transistor degradation.

The free-running ring oscillator 204 and the selectively-enabled ring oscillator 202 have substantially similar circuits including transistors and interconnections. The free-running ring oscillator 204 and the selectively-enabled ring oscillator 202 may be positioned in the integrated circuit 100 in the same location to obtain a measure of transistor degradation in one location. A duplicate pair may be positioned in another location of the integrated circuit to obtain a measure of transistor degradation at a different location on the integrated circuit. Alternatively, another free-running ring oscillator 204 may be positioned at the different location and compared with the same selectively-enabled ring oscillator 202 to obtain a measure of transistor degradation at a different location.

As discussed previously, there are two significant transistor degradation mechanism that are known which affect circuit performance, PMOS BT transistor degradation and NMOS hot electron transistor degradation. Each transistor in the free-running ring oscillator 204 and the selectively-enabled ring oscillator 202 with rectangular shaped channels has a width and a length. Regardless of their size of width and length, the PFETs may experience PMOS BT transistor degradation. NFETs experience hot electron transistor degradation if they have short channels, where the length of their channels is relatively short.

In one embodiment, each transistor of the pair of the free-running ring oscillator 204 and the selectively-enabled ring oscillator 202 may be designed with a relatively short channel, such as less than two microns, one micron to one-tenth of a micron for example. In this case, the NFETs of the free-running ring oscillator 204 experience hot electron transistor degradation and the PFETs of the free-running ring oscillator 204 experience PMOS BT transistor degradation. In this manner, the pair of the free-running ring oscillator 204 and the selectively-enabled ring oscillator 202 can be used to measure the combination of PMOS BT transistor degradation and hot electron transistor degradation.

To avoid hot electron transistor degradation in the NFETs of the free-running ring oscillator 204, each NFET transistor of the pair of the free-running ring oscillator 204 and the selectively-enabled ring oscillator 202 pair can be designed with a relatively long channel, such as greater than two microns for example. In this manner, the pair of the free-running ring oscillator 204 and the selectively-enabled ring oscillator 202 can be used to measure PMOS BT transistor degradation alone without hot electron transistor degradation. The channel lengths of the PFET transistors may be similar to that of the NFET transistors and the widths of both PFET and NFET transistors may be altered accordingly to provide sufficient gain in each inverter to provide an oscillating output.

The free-running ring oscillator 204 operates continuously to generate an oscillating output when the integrated circuit 100 is powered on. A power on control signal 214 generated by the control circuit 208 is coupled into the enable input of the ring oscillator 204.

A characterization signal 212 is generated by the control circuit 208 and coupled into the enable input of the selectively-enabled ring oscillator 202. The selectively-enabled ring oscillator 202 is selectively powered on by the characterization signal 212 when it is desirable to measure transistor degradation. The selectively-enabled ring oscillator 202 acts as a reference ring oscillator to generate a reference ring oscillation signal $F_{REF}$ 213 as it experiences no degradation. The selectively enabled ring oscillator 202 includes transistors without transistor degradation in order to provide a comparison with the degraded transistors of the free-running ring oscillator 204.

The selectively-enabled ring oscillator 202 generates the reference frequency output $F_{REF}$ 213 which is coupled into the comparison circuit 206. The free-running ring oscillator 204 generates a degraded frequency $F_{DEG}$ 215 which is coupled into the comparison circuit 206.

Under control the control circuit 208, the comparison circuit 206 compares the reference frequency 213 with the degraded frequency 215 in order to determine a measure of degradation level 216. As the transistors within the free-running ring oscillator 204 degrade, it is expected that the degraded frequency output signal 215 will have a lower frequency in that of the reference frequency signal 213. Known methods of measuring the frequency of a ring oscillator may be used in the comparison circuit 206, such as that exemplified in U.S. Pat. No. 6,535,013 by Samie B. Samaan, filed Dec. 28, 2000.

Exemplary embodiments of the pair of the free-running ring oscillator 204 and the selectively-enabled ring oscillator 202 are now disclosed.

Referring now to FIG. 3A, a functional block diagram of an enabable ring oscillator 300 is illustrated. The enabable ring oscillator 300 receives an enable signal input EN 302 to selectively enable the oscillations of the ring oscillator and generate a frequency output signal $F_{out}$ 304. The enable signal input 302 enables and disables power from being supplied to the ring oscillator. As is discussed further below, the enabable ring oscillator 300 includes an odd number of inverters coupled in series together in a loop, with the output of the last inverter coupled to the input of the first inverter in the series chain.

Referring now to FIG. 3B, a transistor schematic diagram of the enabable ring oscillator 300' is illustrated. The enabable ring oscillator 300' includes a p-channel field effect transistor (PFET) 310, an n-channel field effect transistor (NFET) 311, PFETs 312A–312N, and NFETs 314A–314N with sources, gates, and drains coupled together as illustrated. Respective pairs of the PFETs 312–312N and the NFETs 314A–314N form a daisy chained loop of N inverters, N being odd, to provide the oscillation output $F_{out}$ 304 from the last transistor pair of PFET 312N and NFET 314N. The oscillation output $F_{out}$ 304 from the last transistor pair of PFET 312N and NFET 314N is coupled to the gates of the first inverter consisting of PFET 312A and NFET 314A. NFETs 314A–314N have sources coupled together to node 320. NFETs 314A–314N coupled to the negative power supply terminal (ground or VSS) through NFET 311 when turned on. The drain of NFET 311 couples to node 320 and its source couples to the negative power supply terminal (ground or VSS). The enable signal 302 is coupled to the gate of NFET 311 and the gate of PFET 310.

The enable signal EN 302 essentially controls whether power is supplied to the daisy chain of inverters of the ring oscillator. When the enable signal 302 is active high to enable the ring oscillator, PFET 310 is turned off and NFET 311 is turned on such that ground is coupled to node 320 to enable the ring oscillator 300' to oscillate and generate an oscillating output signal on $F_{out}$ 304. When enabled, PFETs 312A–312N and NFETs 314A–314N respectively provide an odd number of inverters (N is an odd number) so that the ring oscillator continues to oscillate.

When the enable signal 302 is low, disabling the ring oscillator, PFET 310 is turned on and NFET 311 is turned off. With NFET 311 turned off, the transistor is open and the negative power supply terminal (ground or VSS) is isolated from node 320. Additionally, PFET 310 is turned on to couple the positive power supply terminal (VDD) to node 320.

As discussed previously, the pair of the free-running ring oscillator 204 and the selectively-enabled ring oscillator 202 have substantially similar circuits including transistors and interconnections. In which case, two instances of the enabable ring oscillator 300' are used to provide matching circuits. Note that the channel widths and lengths may be modified as desired.

FIG. 3C illustrates a functional block diagram equivalent of the circuit of the enabable ring oscillator 300' of FIG. 3B. Inverters 330A–330N are coupled in series together in a daisy chain with the output of the last inverter 330N coupled to the input of the first inverter 330A. Inverters 330A–330N are coupled to a ground enable 302'. Logically, the ground enable 302' enables and disables the negative power supply or ground from being coupled to the inverter chain 330A–330N.

When the enabable ring oscillator 300' is enabled, an AC waveform is generated on the $F_{out}$ signal output 304. When the enabable ring oscillator 300' is disabled, the output $F_{out}$ 304 may float to VDD while node 320 is tied to VDD.

Referring now to FIG. 3D, a transistor schematic diagram of an enabable ring oscillator 300" is illustrated. The enabable ring oscillator 300" includes p-channel field effect transistor (PFET) 340, n-channel field effect transistor (NFET) 341, PFETs 342A–342I, NFETs 344A–344N, PFET 346, NFET 347, PFET 348, and NFET 349 with sources, gates, and drains coupled together as illustrated. The enabable ring oscillator 300" further includes an inverter 343 with an input coupled to a select input signal SEL 352 and an output coupled to the gates of NFET 347 and PFET 348. A data input signal DATAIN 350 couples to the sources or drains of the PFET 346 and the NFET 347. The output Fout 304' of the enabable ring oscillator couples to the sources or drains of PFET 348 and NFET 349. The NFETs 344A–344I have sources coupled together to node 355. NFETs 344A–344N couple to the negative power supply terminal (ground or VSS) through NFET 341 when its turned on. The drain of NFET 341 couples to node 355 and its source couples to the negative power supply terminal (ground or VSS). The enable signal 302 is coupled to the gate of NFET 341 and the gate of PFET 340.

In comparison with the enabable ring oscillator 300', the enabable ring oscillator 300" has respective pairs of the PFETs 342A–342I and the NFETs 344A–344I to form a daisy chained series of nine inverters. It should be understood that more or less PFETs and NFETs paired together may be used to form N inverters, where N is an odd number, as is disclosed in FIG. 3B. The enabable ring oscillator 300" further includes a multiplexer formed out of a pair of transfer gates (transistors 346–349) and inverter 343. An output node 354 of the multiplexer is coupled to the gates of the PFET 342A and the gate of the NFET 344A. The multiplexer is controlled to output either DATAIN 350 or $F_{out}$ 304' on its output node 354 in response to the select input SEL 352. The select input SEL 352 and its inversion formed by inverter 343, controls the pair of transfer gates (transistors 346–349) to select one of the two data inputs into the multiplexer that is to be output from the multiplexer. If $F_{out}$ 304' is selected to be output onto node 354, the enabable ring oscillator 300" functions in a ring oscillating mode. If DATAIN 350 is selected to be output onto node 354, the enabable ring oscillator 300" functions in a data toggle mode.

In a data toggle mode, the nine inverters formed out of PFETs 342A–342I and NFETs 344A–344I change state as the data input DATAIN 350 changes state. The data input DATAIN 350 may be a stress pattern of ones and zeroes causing the inverters to continuously change from one logic state to another. For example, the data input DATAIN 350 may couple to a clock terminal and the stress pattern may be a clock signal. As another example, the data input DATAIN 350 may couple to a logic node internally within an integrated circuit and the stress pattern may be an actual data pattern. In this manner, the enabable ring oscillator 300" may experience the same switching frequency at an actual node of a functional circuit and receive substantially similar AC stress.

The enabable ring oscillator 300" is also controlled by the enable signal EN 302. The enable signal EN 302 essentially controls whether power is supplied to the daisy chain series of nine inverters.

When the enable signal 302 is active high to enable and provide power to the nine inverters, PFET 340 is turned off and NFET 341 is turned on such that ground is coupled to node 355. If in a ring oscillating mode, the enable signal enables the ring oscillator 300" to oscillate and generate an oscillating output signal on $F_{out}$ 304'. If in a data toggle mode, the enable signal enables the inverters in the ring oscillator 300" to toggle states in response to changes of state in DATAIN 350. In summary, when enabled by the enable input, the PFETs 342A–342N and NFETs 344A–344N receive power in order to provide an odd number of functional inverters (N is an odd number).

When the enable signal 302 is low, disabling the ring oscillator, PFET 340 is turned on and NFET 341 is turned off. With NFET 341 turned off, the transistor is open and the negative power supply terminal (ground or VSS) is isolated from node 355. Additionally, PFET 340 is turned on to couple the positive power supply terminal (VDD) to node 355 regardless of the state of node 354.

Two instances of the enabable ring oscillator 300" are used to provide matching pair of circuits for a characterization monitor. Note that the channel widths and lengths may be modified in the enabable ring oscillator as desired.

Figure 3E:
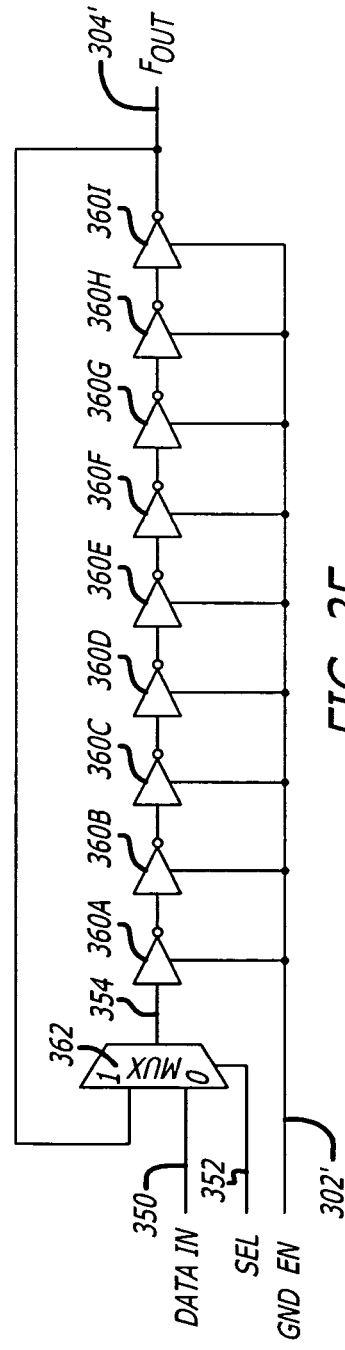
FIG. 3E illustrates a functional block diagram of the elements of the enabable ring oscillator of FIG. 3D.

FIG. 3E illustrates a functional block diagram equivalent of the circuit of the enabable ring oscillator 300" of FIG. 3D. A two to one multiplexer 362 has an output 354 coupled to the input of a first of nine inverters 360A–360I that are coupled in series together in a daisy chain. The output of the last inverter 360I is coupled to one of the two data inputs of the multiplexer 362. The data input signal DATAIN 350 is coupled to the other of the two data inputs of the multiplexer 362. The select input signal SEL 352 is coupled into the control input of the multiplexer 362 to select whether the enabable ring oscillator 300" functions in a ring oscillating mode or a data toggle mode.

Inverters 360A–360I are coupled to a ground enable 302'. Logically, the ground enable 302' enables and disables the negative power supply VSS or ground from being coupled to the inverter chain 360A–360I.

When the enabable ring oscillator 300" is enabled in a ring oscillating mode, an AC waveform is generated on the $F_{out}$ signal output 304'. When the enabable ring oscillator 300" is disabled, regardless of the functional mode, the output $F_{out}$ 304' may float to ground while node 355 is tied to VDD.

When the enabable ring oscillator 300" is enabled in a data toggle mode, the $F_{out}$ signal output 304' changes state in response to changes of state in the data input signal DATAIN 350. The $F_{out}$ signal output 304' may have an inverted logical state from that of the data input signal DATAIN 350. An inverter may be added between DATAIN 350 and the transfer gate (transistors 346–347) so that the $F_{out}$ signal output 304' is not inverted from the logical state of the data input signal DATAIN 350.

While inverters coupled in series together in a daisy chain have been disclosed to provide an odd number of inversions of the ring oscillator, it is understood that any other inverting logic gate may be used, such as NOR gates and/or NAND gates with a switched power supply terminal. An inverting logic gate is a logic gate that receives a logical input signal and inverts it when generating a logical output signal. That is, inverters 330A–330N or inverters 360A–360I may be a combination of inverters, NAND gates, and NOR gates with the respective transistors being added to provide such gating. Additionally, the inverting logic gates may be coupled together into a series circuit and non-inverting logic gates may be interleaved between pairs of inverting logic gates. A non-inverting logic gate is a logic gate that receives a logical input signal and does not invert it when generating a logical output signal. Examples of non-inverting logic gates include a pass gate or transfer gate, an AND gate, an OR gate, and a buffer. With interleaved non-inverting logic gates included in the series circuit of inverting logic gates, the series circuit can be used to more closely resemble a data path.

FIGS. 3A–3E illustrate embodiments of enabable ring oscillators that are selectively biased on by switching the negative power supply terminal (GND or VSS). However, an enabable ring oscillator may also be selectively biased on by switching the positive power supply terminal (VDD).

Referring now to FIG. 4A, a functional block diagram of an enabable ring oscillator 400 is illustrated. Enabable ring oscillator 400 receives an enable prime input signal ENP 402 to selectively enable the oscillations of the ring oscillator. The enabable ring oscillator 400 has an output $F_{out}$ 404 to provide the oscillating output. The enable signal input 402 enables and disables power from being supplied to the ring oscillator. As is discussed further below, the enabable ring oscillator 400 includes an odd number of inverters coupled in series together in a loop, with the output of the last inverter coupled to the input of the first inverter in the series chain.

Referring now to FIG. 4B, a transistor schematic diagram of an enabable ring oscillator 400' is illustrated. The enabable ring oscillator 400' includes PFET 410, NFET 411, PFETs 412A–412N, and NFETs 414A–414N coupled together as shown and illustrated.

Respective pairs of the PFETs 412A–412N and the NFETs 414A–414N form a daisy chained loop of N inverters, N being odd, to provide the oscillation output $F_{out}$ 404 from the last transistor pair of PFET 412N and NFET 414N. The oscillation output $F_{out}$ 404 from the last transistor pair of PFET 412N and NFET 414N is coupled to the gates of the first inverter consisting of PFET 412A and NFET 414A to complete the loop. NFETs 414A–414N have sources coupled together to the negative power supply (VSS or GND). PFETs 412A–412N couple to the positive power supply terminal (VDD) through PFET 410 when turned on. The drain of PFET 410 couples to node 420 and its source couples to the positive power supply terminal (VDD). The enable prime signal 402 couples to the gates of PFET 410 and NFET 411 to control the coupling of the positive power supply (VDD) to node 420.

The enable prime signal ENP 402 essentially controls whether power is supplied to the daisy chain of inverters of the ring oscillator. When enable prime ENP 402 is active low to enable the ring oscillator 400', NFET 411 is turned off and PFET 410 is turned on to couple the positive power supply (VDD) to node 420 and enable the ring oscillator 400 to oscillate and generate an oscillating output signal on $F_{out}$ 404. When enabled, PFETs 412A–412N and NFETs 414A–414N respectively provide an odd number of inverters (N is an odd number) so that the ring oscillator continues to oscillate.

When the enable prime signal ENP 402 is high, disabling the ring oscillator, PFET 410 is turned off and NFET 411 is turned on. With PFET 410 turned off, the transistor is open and the positive power supply (VDD) is isolated from node 420 and NFET 411 couples node 420 to the negative power supply terminal (ground or VSS).

As discussed previously, the pair of the free-running ring oscillator 204 and the selectively-enabled ring oscillator 202 have substantially similar circuits including transistors and interconnections. In which case, two instances of the enabable ring oscillator 400' are used to provide matching circuits. Note that the channel widths and lengths of the transistors may be modified as desired.

FIG. 4C illustrates a functional block diagram of the enabable ring oscillator 400'. A series chain of inverters 430A–430N are serially coupled together with the output of the final inverter 430N coupled to the input of the first inverter 430A. A VDD enable input 402' is coupled to each of the inverter 430A–430N. Logically, the VDD enable 402' selectively enables and disables the positive power supply (VDD) being coupled to each inverter 430A–430N in the inverter chain, and enables and disables the stress of the transistors in this circuit.

When the enabable ring oscillator 400' is enabled, an AC waveform is generated on the $F_{out}$ signal output 404. When the enabable ring oscillator 400 is disabled, the output $F_{out}$ 404 may float to ground while node 420 is tied to ground.

Figure 4D:
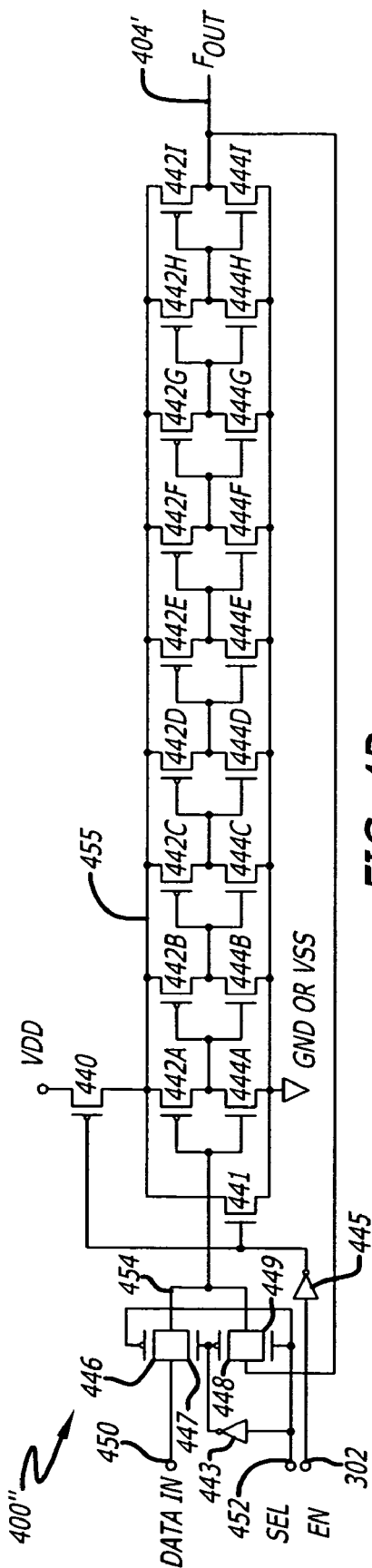
FIG. 4D illustrates another transistor schematic diagram of another embodiment of an enabable ring oscillator.

Referring now to FIG. 4D, a transistor schematic diagram of an enabable ring oscillator 400" is illustrated. The enabable ring oscillator 400" includes p-channel field effect transistor (PFET) 440, n-channel field effect transistor (NFET) 441, PFETs 442A–442I, NFETs 444A–444N, PFET 446, NFET 447, PFET 448, and NFET 449 with sources, gates, and drains coupled together as illustrated. The enabable ring oscillator 400" further includes a first inverter 443 with an input coupled to a select input signal SEL 452 and an output coupled to the gates of NFET 447 and PFET 448. The enabable ring oscillator 400" may further include a second inverter 445 with an input coupled to the active high enable signal 302 to invert it and an output coupled to the gates of PFET 440 and NFET 441. A data input signal DATAIN 450 couples to the sources or drains of the PFET 446 and the NFET 447. The output Fout 404' of the enabable ring oscillator couples to the sources or drains of PFET 448 and NFET 449. The NFETs 444A–444I and 441 have sources coupled together to the negative power supply terminal (ground or VSS). PFETs 442A–442I couple to the positive power supply terminal VDD through PFET 440 when its turned on. The drain of PFET 440 couples to node 455 and its source couples to the positive power supply terminal VDD. The inversion of the enable signal EN 302, the output from the inverter 445, is coupled to the gate of NFET 441 and the gate of PFET 440.

In comparison with the enabable ring oscillator 400', the enabable ring oscillator 400" has respective pairs of the PFETs 442A–442I and the NFETs 444A–444I to form a daisy chained series of nine inverters. It should be understood that more or less PFETs and NFETs paired together may be used to form N inverters, where N is an odd number, as is disclosed in FIG. 4B. The enabable ring oscillator 400" further includes a multiplexer formed out of a pair of transfer gates (transistors 446–449) and inverter 443. An output node 454 of the multiplexer is coupled to the gates of the PFET 442A and the gate of the NFET 444A. The multiplexer is controlled to output either DATAIN 450 or $F_{out}$ 404' on its output node 454 in response to the select input SEL 452. The select input SEL 452 and its inversion formed by inverter 443, controls the pair of transfer gates (transistors 446–449) to select one of the two data inputs into the multiplexer that is to be output from the multiplexer. If $F_{out}$ 404' is selected to be output onto node 454, the enabable ring oscillator 400" functions in a ring oscillating mode. If DATAIN 450 is selected to be output onto node 454, the enabable ring oscillator 400" functions in a data toggle mode.

In a data toggle mode, the nine inverters formed out of PFETs 442A–442I and NFETs 444A–444I change state as the data input DATAIN 450 changes state. The data input DATAIN 450 may be a stress pattern of ones and zeroes causing the inverters to continuously change from one logic state to another. For example, the data input DATAIN 450 may couple to a clock terminal and the stress pattern may be a clock signal. As another example, the data input DATAIN 450 may couple to a logic node internally within an integrated circuit and the stress pattern may be an actual data pattern. In this manner, the enabable ring oscillator 400" may experience the same switching frequency at an actual node of a functional circuit and receive substantially similar AC stress.

The enabable ring oscillator 400" is also controlled by the enable signal EN 302. The enable signal EN 302 essentially controls whether power is supplied to the daisy chain series of nine inverters.

When the enable signal 302 is active high to enable and provide power to the nine inverters, PFET 440 is turned on such that the positive power supply VDD is coupled to node 455 and NFET 441 is turned off. If in a ring oscillating mode, the enable signal 302 enables the ring oscillator 400" to oscillate and generate an oscillating output signal on $F_{out}$ 404'. If in a data toggle mode, the enable signal enables the inverters in the ring oscillator 400" to toggle states in response to changes of state in DATAIN 450. In summary, when enabled by the enable input, the PFETs 442A–442I and NFETs 444A–444I receive power in order to provide an odd number of functional inverters (N is an odd number).

When the enable signal 302 is low, disabling the ring oscillator, PFET 440 is turned off and NFET 441 is turned on. With PFET 440 turned off, the transistor is open and the positive power supply terminal VDD is isolated from node 455. Additionally, NFET 441 is turned on to couple the negative power supply terminal (VSS or ground) to node 455 regardless of the state of node 454.

Two instances of the enabable ring oscillator 400" are used to provide matching pair of circuits for a characterization monitor. Note that the channel widths and lengths may be modified in the enabable ring oscillator as desired.

Figure 4E:
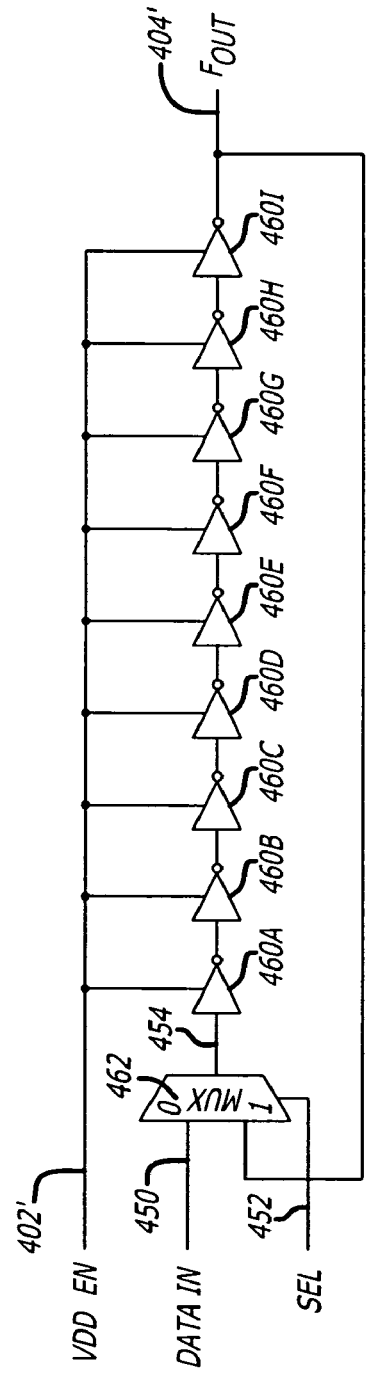
FIG. 4E illustrates a functional block diagram of the elements of the enabable ring oscillator of FIG. 4D.

FIG. 4E illustrates a functional block diagram equivalent of the circuit of the enabable ring oscillator 400" of FIG. 4D. A two to one multiplexer 462 has an output 454 coupled to the input of a first of nine inverters 460A–460I that are coupled in series together in a daisy chain. The output of the last inverter 460I is coupled to one of the two data inputs of the multiplexer 462. The data input signal DATAIN 450 is coupled to the other one of the two data inputs of the multiplexer 462.

The select input signal SEL 452 is coupled into the control input of the multiplexer 462 to select whether the enabable ring oscillator 400" functions in a ring oscillating mode or a data toggle mode. The select input signal SEL 452 is a logical high level to select the ring oscillating mode and a logical low level to select the data toggle mode in one embodiment.

Inverters 460A–460I are coupled to a VDD enable VDD EN 402'. Logically, the VDD enable 402' enables and disables the positive power supply VDD from being coupled to the inverter chain 460A–460I.

When the enabable ring oscillator 400" is enabled in a ring oscillating mode, an AC waveform is generated on the $F_{out}$ signal output 404'. When the enabable ring oscillator 400" is disabled, regardless of the functional mode, the output $F_{out}$ 404' may float to ground while node 455 is tied to the negative power supply terminal VSS or ground GND.

When the enabable ring oscillator 400" is enabled in a data toggle mode, the $F_{out}$ signal output 404' changes state in response to changes of state in the data input signal DATAIN 450. The $F_{out}$ signal output 404' may have an inverted logical state from that of the data input signal DATAIN 450. An inverter may be added between DATAIN 450 and the transfer gate (transistors 446–447) so that the $F_{out}$ signal output 404' is not inverted from the logical state of the data input signal DATAIN 450.

If the enabable ring oscillator 400" is to be used as the selectively-enabled ring oscillator or a reference ring oscillator, the data input signal DATAIN 450 may not be used and can be coupled to the positive power supply terminal VDD or the negative power supply terminal VSS or ground and Fout may be selected as the multiplexer input.

If the enabable ring oscillator 400" is to be used as the free-running ring oscillator or a degraded ring oscillator, the data input signal DATAIN 450 may be selected by the multiplexer and a stress pattern may be used to exercise the ring oscillator. The stress pattern may be an alternating current (AC) pattern such as a clock to apply AC stress or a direct current (DC) pattern which is static in order to apply DC stress. In this manner, the stress on the free-running ring oscillator or degraded ring oscillator may be substantially similar to a selected data path of a functional block. In another case, the data input signal DATAIN 450 is not selected and can be coupled to the positive power supply terminal VDD or the negative power supply terminal VSS or ground while the ring oscillator is used to apply stress to the transistors. In another case, the data input signal DATAIN 450 may be used during the period of characterization when enabled and selected by the multiplexer, otherwise the $F_{out}$ may be selected and the ring oscillation output is used to characterize the transistor degradation.

While inverters coupled in series together in a daisy chain have been disclosed to provide an odd number of inversions of the ring oscillator, it is understood that any other inverting logic gate may be used, such as NOR gates and/or NAND gates with a switched power supply terminal. An inverting logic gate is a logic gate that receives a logical input signal and inverts it when generating a logical output signal. That is, inverters 430A–430N or inverters 460A–460I may be a combination of inverters, NAND gates, and NOR gates with the respective transistors being added to provide such gating. Additionally, the inverting logic gates may be coupled together into a series circuit and non-inverting logic gates may be interleaved between pairs of inverting logic gates. A non-inverting logic gate is a logic gate that receives a logical input signal and does not invert it when generating a logical output signal. Examples of non-inverting logic gates include a pass gate or transfer gate, an AND gate, an OR gate, and a buffer. With interleaved non-inverting logic gates included in the series circuit of inverting logic gates, the series circuit can be used to more closely resemble a data path.

Figure 5:
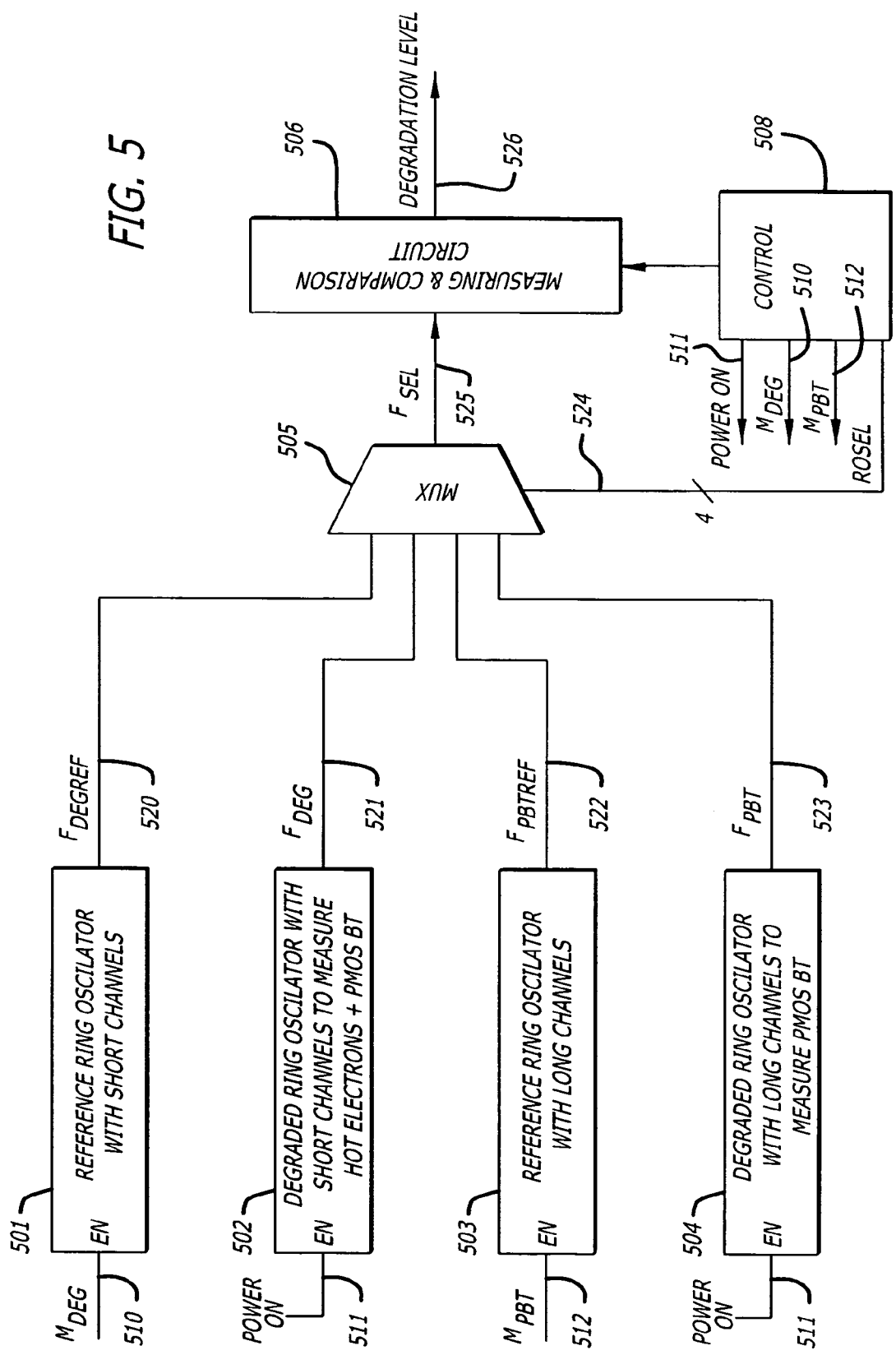
FIG. 5 illustrates a functional block diagram of the integrated on-chip characterization blocks to provide transistor degradation monitoring as another embodiment of the invention.

Referring now to FIG. 5, a functional block diagram of another embodiment of the invention is illustrated. FIG. 5 illustrates functional blocks to perform on-chip characterization of transistor degradation including a first reference ring oscillator 501, a first degraded ring oscillator 502, a second reference ring oscillator 503, a second degraded ring oscillator 504, a multiplexer 505, a measurement and comparison circuit 506, and a control circuit 508. In this embodiment, a measure of PMOS BT transistor degradation may be determined alone and a measure of the combined PMOS BT and hot electron transistor degradation may be determined. Further, by subtracting the measure of PMOS BT transistor degradation from the combined measure of the PMOS BT and hot electron transistor degradation, the hot electron transistor degradation may be determined.

The ring oscillators 501–504 may be an embodiment of the enabable ring oscillators previously described with reference to FIGS. 3A–3E and FIGS. 4A–4E.

The first reference ring oscillator 501 and the first degraded ring oscillator 502 have matching circuitry with short channels in order to measure hot electron effects in PMOS-BT degradation. The second reference ring oscillator 503 and second degraded ring oscillator 504 both have long channels in order to measure the PMOS-BT degradation with no hot electron degradation.

Control circuit 508 generates a power on control signal 511, a measure degradation control signal $M_{DEG}$ 510, and a measure PMOS-BT degradation control signal $M_{PBT}$ 512, as well as other control signals for on-chip characterization of transistor degradation. The power on control signal 511 is coupled to the enable inputs of the degraded ring oscillators 502 and 504. In this manner the degraded ring oscillators 502 and 504 are free-running provided that power is supplied to the integrated circuit 100. Ring oscillators 502 and 504 are free-running in order to model the constant switching of circuitry in the functional blocks 104 of the integrated circuit 100. The reference ring oscillators 501 and 503 are selectively enabled in order to provide the characterization of the transistor degradation.

The outputs of the reference ring oscillators are compared with the outputs of the degraded ring oscillators. The output $F_{DEGREF}$ 520 of the reference ring oscillator 501 is compared with the output $F_{DEG}$ 521 of the degraded ring oscillator 502. The output $F_{PBTREF}$ 522 from the referencing oscillator 503 is compared with the output $F_{PBT}$ 523 of the degraded ring oscillator 504.

The multiplexer 505 receives ring oscillator select signals 524 from the control circuit 508 and the outputs $F_{DEGREF}$ 520, $F_{DEG}$ 521 $F_{PBTREF}$ 522, $F_{PBT}$ 523 of the ring oscillators. In response to the select signals, the multiplexer 505 couples the appropriate oscillating output on to the $F_{SEL}$ 525 into the measurement and comparison circuit 506. In alternate embodiments, one or more of the outputs from the oscillators may be coupled into the measurement and comparison circuit 506 at a time, bypassing the multiplexer 505, if simultaneous comparisons are desirable.

The measurement and comparison circuit 506 determines the desired characteristics of the selected waveform $F_{SEL}$ 525 from the multiplexer 505 and performs a comparison between the respective reference and degraded ring oscillator signals. The measurement and comparison circuit 506 generates one or more measures of a degradation level output 526 in response to the measurements and comparisons made. Known methods of measuring the frequency of a ring oscillator may be used in the measurement and comparison circuit 506, such as that exemplified in U.S. Pat. No. 6,535,013 B2 by Samie B. Samaan, filed Dec. 28, 2000.

Moreover, the enabable ring oscillators disclosed herein may be used in the small Functional Unit Blocks ("FUB-lets") disclosed in U.S. Pat. No. 6,535,013 B2 with information being accessed through one or more Test Access Ports ("TAPs").

For example in one period of time, a measure of PMOS BT transistor degradation is determined alone. In another period of time, a measure of the combined PMOS BT and hot electron transistor degradation is determined. In another period of time, the hot electron transistor degradation is determined by subtracting the measure of PMOS BT transistor degradation form the combined measure of the PMOS BT and hot electron transistor degradation.

As previously discussed, the degradation level output 526 may be used internally within the integrated circuit or provided off chip in order that better characterization and simulation of the process and integrated circuit may be made.

Figure 6:
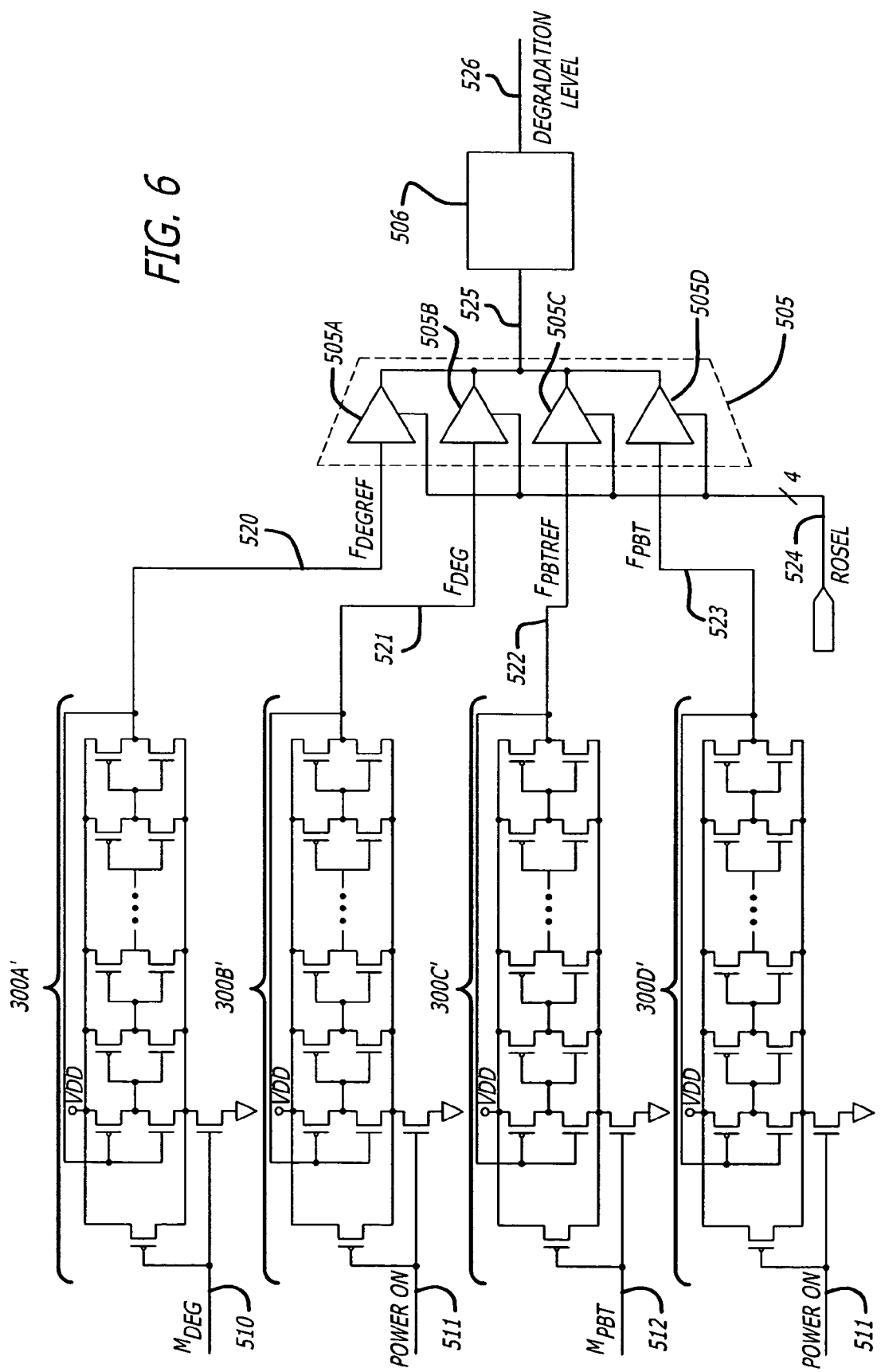
FIG. 6 illustrates a schematic diagram of the integrated on-chip characterization blocks to provide transistor degradation monitoring as another embodiment of the invention.

Referring now to FIG. 6, a schematic diagram of an on-chip characterization circuit is illustrated. In order to accurately quantify transistor degradation accumulated on an operational device over its lifetime of use, the on-chip characterization circuit or monitor is implemented within the device.

The on-chip characterization circuit illustrated in FIG. 6 includes four enabable ring oscillators 300A'–300D', four tristate drivers 505A–505D having inputs respectively coupled to the outputs of the enabable ring oscillators 300A'–300D', a measure and compare circuit 506 coupled to the four tristate drivers 505A–505D in order to generate a degradation level output 526. It is understood that there is some control means to control the on-chip characterization circuit, such as the control circuit 508 illustrated in FIG. 5, but it is not shown in FIG. 6.

The four enabable ring oscillators 300A'–300D' may each be an instance of the enabable ring oscillator 300' illustrated in FIG. 3B. Alternatively, the four enabable ring oscillators 300A'–300D' may each be an instance of the enabable ring oscillators 300", 400', or 400" illustrated in FIGS. 3D, 4B, and 4D, respectively, with modifications being made to the polarity of the enable input signals, if needed.

In one embodiment, there are nine inverters, an odd number, in each of the ring oscillators 300A', 300B', 300C', and 300D'. The enabable ring oscillators 300A' and 300B' are identical or substantially similar and have their transistors designed with short channels to measure both PMOS BT and hot electron transistor degradation. The enabable ring oscillators 300C' and 300D' are identical or substantially similar and have their transistors designed with relatively long channels to measure PMOS BT transistor degradation with minimal hot electron transistor degradation or none at all. Thus, the pair of ring oscillators 300C' and 300D' may also be referred to as a PMOS BT degradation monitor.

The power on control signal 511 is coupled into the enable inputs of the enabable ring oscillators 300B' and 300D' so they experience the operational stress of the integrated circuit over its lifetime. The $M_{DEG}$ control signal 510 is coupled into the enable input of the enabable ring oscillator 300A' so that it is selectively powered on to measure transistor degradation and avoid the operational stress of the integrated circuit. The $M_{PBT}$ control signal 512 is coupled into the enable input of the enabable ring oscillator 300C' so that it is selectively powered on to measure transistor degradation and avoid the operational stress of the integrated circuit.

When the integrated circuit 100 is powered up, one of each pair of ring oscillators is also powered up and enabled to oscillate. Enabable Ring oscillators 300B' and 300D' receive the power on control signal 511 at their enable inputs so they are placed under stress whenever the integrated circuit 100 with its functional blocks are powered on. The NFET and the PFET transistors in the ring oscillator of each undergo AC stress. As the enabable ring oscillators 300B' and 300D' are always powered on, they may be referred to as being stressed ring oscillators.

Enabable ring oscillators 300A' and 300C' are almost always powered off and disabled. When measurements are taken to determine the transistor degradation levels, the enabable ring oscillators 300A' and 300C' are then momentarily powered on and enabled to oscillate. As the enabable ring oscillators 300A' and 300C' are only momentarily power on, they may be referred to as being fresh ring oscillators.

As discussed previously, the pair of ring oscillators 300C' and 300D' have channel lengths longer than the minimum channel length supported by the process, they have relatively long channels to reduce the impact of hot electron degradation to a negligible level. In this manner, the frequency degradation of the ring oscillator 300D' can be treated as contributed by PMOS BT degradation only. As discussed previously, PMOS BT degradation occurs when the PFETs or PMOS devices are turned on, regardless of whether or not they are in a static turned on state (DC) or dynamically turned on (AC). To avoid PMOS BT degradation in the enabable ring oscillator 300C', the $M_{PBT}$ input 512 is almost always at a state to keep power off to the ring oscillator and keep it disabled. In this manner, all the PFETs or PMOS devices in the enabable ring oscillator 300C' will be turned off. The enabable ring oscillator 300C' is usually only powered on and enabled during characterization.

The second pair of enabable ring oscillators 300A' and 300B' are designed using the same transistor network but have minimum channel length NFETs or NMOS devices in order to obtain NMOS hot electron transistor degradation data. The enabable ring oscillator 300B' which is constantly under stress while the integrated circuit is powered on, experiences both PMOS BT and NMOS hot electron transistor degradation, similar to that of the ordinary circuit data paths in the functional blocks of the integrated circuit 100. The $M_{DEG}$ input 510 is almost always at a state to keep power off to the enabable ring oscillator 300A' and disabled so that it remains being a fresh ring oscillator without PMOS BT and NMOS hot electron transistor degradation. As the second pair of enabable ring oscillators 300A' and 300B' measure both, they may be referred to as being a transistor degradation monitor.

Comparing the frequency of the oscillating signal output from the enabable ring oscillator 300B' continuously enabled under stress (also referred to as the stress ring oscillator), with the frequency of the oscillating signal output from the enabable ring oscillator 300A' which is a fresh ring oscillator, will reveal a frequency degradation if there is transistor degradation. This frequency degradation is proportional to amount of PMOS BT and hot electron transistor degradation experienced by the enabable ring oscillator 300B' continuously enabled and under stress.

Knowing the amount of PMOS BT degradation from the enabable ring oscillators 300C' and 300D' (the PMOS BT degradation monitor), the additional degradation uncovered from the enabable ring oscillators 300A' and 300B' can be contributed to NMOS hot electron transistor degradation. Knowing both the PMOS BT and NMOS hot electron transistor degradation parameters, simulation models may be used analyze critical speed path degradation. The enabable ring oscillators 300A' and 300B' (the transistor degradation monitor) can also be used to identify degradation variance between identical enabable ring oscillators at different locations.

The outputs ($F_{DEGREF}$ 520, $F_{DEG}$ 521, $F_{PBTREF}$ 522, and $F_{PBT}$ 523) of the four enabable ring oscillators 300A'–300D' may respectively couple into the inputs of the four tristate drivers 505A–505D. The four tristate drivers 505A–505D may be selectively enabled by the ring oscillator select signal ROSEL 524 in order to function as multiplexer 505 and multiplex the four outputs one or more at a time into the measure and compare circuit 506 over the one or more lines of $F_{SEL}$ 525.

As discussed previously, the measure and compare circuit 506 receives the respective outputs ($F_{DEGREF}$ 520, $F_{DEG}$ 521, $F_{PBTREF}$ 522, and $F_{PBT}$ 523) from the four enabable ring oscillators 300A'–300D' and determines one or more levels of transistor degradation and couples them out onto the degradation level output 526. The matched pair of enabable ring oscillators 300A' and 300B' are identical being designed with matching schematics and layout. The matched pair of enabable ring oscillators 300C' and 300D' are identical being designed with matching schematics and layout. Therefore, statistically, the mean values of the oscillating frequencies of the matched pair of ring oscillators when both are newly manufactured (i.e., "fresh") should be identical or with a fixed intrinsic skew. As time passes and the transistors age when put under stress, the comparison of the mean frequency values of the matched pair of ring oscillators after stress to the one, the transistor degradation information can be easily obtained.

As discussed previously, the degradation level output 526 may be used internal or external to the integrated circuit 100. Additionally, the collection of data and the processing of it may be performed automatically. The integrated circuits while in the field in user systems, may pass the transistor degradation information into a central data base so that it can be gathered together and evaluated across all integrated circuits in the field. This information can be used to evaluate transistor aging impact to special circuits, critical speed paths and maximum degradation, as well as to ascertain the risks and returns associated with using reliability guard bands for an integrated circuit product.

Figure 7:
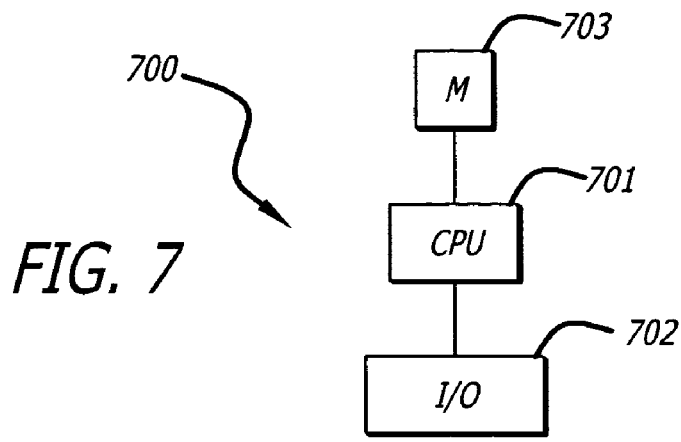
FIG. 7 illustrates a block diagram of a typical computer system in which embodiments of the invention may be utilized.

Referring now to FIG. 7, a block diagram of a typical computer 700 in which the embodiments of the invention may be utilized is illustrated. The computer 700 includes a central processing unit (CPU) 701, input/output devices (I/O) 702 such as keyboard, modem, printer, external storage devices and the like and monitoring devices (M) 703 such as a CRT or graphics display. The monitoring devices (M) 703 provide computer information in a human intelligible format such as visual or audio formats.

Figure 8:
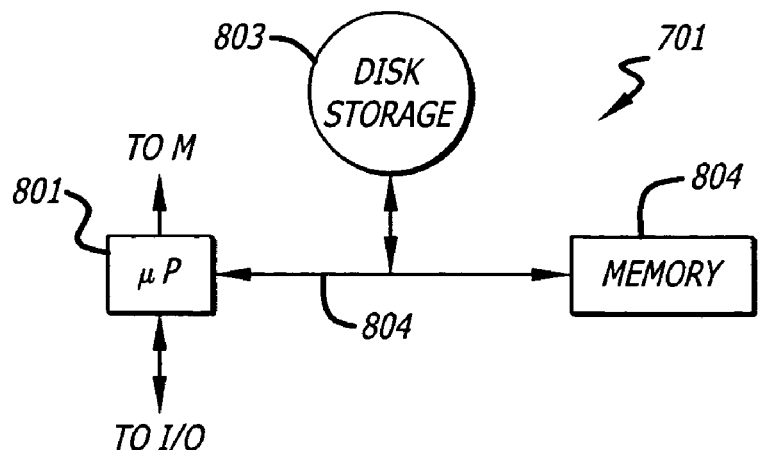
FIG. 8 illustrates a block diagram of a central processing unit in which embodiments of the invention may be utilized.

Referring now to FIG. 8, a block diagram of a typical central processing unit 701 in which the embodiments of the invention may be utilized is illustrated. The central processing unit 701 includes a microprocessor 801 including the embodiments of the invention, a disk storage device 803, and a memory 804 for storing program instructions coupled together. Disk storage device 803 may be a floppy disk, zip disk, DVD disk, hard disk, rewritable optical disk, flash memory or other non-volatile storage device. The microprocessor 801 and the disk storage device 803 can both read and write information into memory 804 over the memory bus 804. Memory 804 is typically dynamic random access memory (DRAM) but may be other types of rewritable storage.

The microprocessor 801 is an integrated circuit 100 in one embodiment as illustrated in FIG. 1 including the on-chip characterization circuitry or block 102 and the one or more functional circuits or blocks 104. In this case, at least one of the one or more functional circuits or blocks 104 may be an execution unit to execute one or more instructions. The one or more instructions may be from a software program for example.

As scaling down of transistors has increased, transistor degradation due to aging is increasing. The introduction of new gate materials in semiconductor processes and the corresponding frequency increase have also caused increases in transistor degradation as the integrated circuits age. Monitoring the actual effects of transistor degradation on a functional device has become more important. The embodiments of the invention can provide an integrated on-chip characterization of transistor degradation to determine reliability and verify the robustness of circuit designs in integrated circuits.

While certain exemplary embodiments of the invention have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit comprising:
   one or more functional blocks to perform one or more functions; and
   an integrated on-chip characterization circuit including
      a selectively enabled ring oscillator to generate a reference oscillating signal,
      a free-running ring oscillator to generate a free-running oscillating signal, and
      a comparison circuit coupled to the selectively enabled ring oscillator and the free-running ring oscillator, the comparison circuit to periodically determine a measure of transistor degradation including at least one of p-channel metal oxide semiconductor field effect transistor bias temperature (PMOS BT) degradation and hot electron transistor degradation;
   wherein the selectively enabled ring oscillator and the free-running ring oscillator are located in the same area of the integrated circuit.

2. The integrated circuit of claim 1, wherein the free-running ring oscillator generates the free-running oscillating signal in response to the integrated circuit being powered on.

3. The integrated circuit of claim 2, wherein the selectively enabled ring oscillator generates the reference oscillating signal in response to determining the measure of transistor degradation.

4. The integrated circuit of claim 1, wherein the free-running ring oscillator and the selectively enabled ring oscillator have transistors with long channel lengths; and the comparison circuit determines a measure of PMOS bias temperature transistor degradation.

5. The integrated circuit of claim 1, wherein the free-running ring oscillator and the selectively enabled ring oscillator have transistors with short channel lengths; and the comparison circuit determines a combined measure of PMOS bias temperature and hot electron transistor degradation.

6. The integrated circuit of claim 1, wherein the free-running ring oscillator has degraded transistors; and the selectively enabled ring oscillator is without degraded transistors.

7. The integrated circuit of claim 1. wherein:
the free-running ring oscillator and the selectively enabled ring oscillator are substantially similar circuits;
the selectively enabled ring oscillator is selectively enabled to avoid transistor degradation; and
the free-running ring oscillator is continuously enabled to experience transistor degradation.

8. The integrated circuit of claim 7, wherein
the selectively enabled ring oscillator is selectively enabled by a characterization signal; and
the free-running ring oscillator is continuously enabled by a power-on signal.

9. The integrated circuit of claim 8, further comprising:
a control circuit to generate the characterization signal and the power-on signal, and to control the comparison circuit in determining the measure of the transistor degradation.

10. The integrated circuit of claim 1, wherein the integrated circuit is a microprocessor.

11. A method in an integrated circuit with functional blocks, the method comprising:
generating a free-running oscillation signal to degrade transistors in a first ring oscillator,
selectively generating a reference oscillation signal in a second ring oscillator, and
periodically comparing the free-running oscillation signal with the reference oscillation signal to characterize the transistor degradation in the transistors of the integrated circuit, the transistor degradation including at least one of p-channel metal oxide semiconductor field effect transistor bias temperature (PMOS BT) degradation and hot electron transistor degradation;
wherein the first ring oscillator and the second ring oscillator are located in the same area of the integrated circuit.

12. The method of claim 11 further comprising:
performing one or more functions with the functional blocks.

13. The method of claim 12, wherein
the functional blocks include an execution unit to execute instructions; and
the integrated circuit is a microprocessor.

14. The method of claim 11, wherein the first ring oscillator and the second ring oscillator have substantially similar circuits.

15. The method of claim 14, wherein the first ring oscillator has degraded transistors; and the second ring oscillator has transistors without degradation.

16. The method of claim 14, wherein
the first ring oscillator and the second ring oscillator have transistors with long channel lengths; and
the comparing determines a PMOS bias temperature transistor degradation in the transistors of the integrated circuit.

17. The method of claim 14, wherein
the first ring oscillator and the second ring oscillator have transistors with short channel lengths; and
the comparing determines a combined PMOS bias temperature and hot electron transistor degradation in the transistors of the integrated circuit.

18. The method of claim 11, wherein
the first ring oscillator is continuously enabled to experience transistor degradation; and the second ring oscillator is selectively enabled to avoid transistor degradation by switching a power supply.

19. A system comprising:
a processor for executing instructions and processing data, transistors of the processor to experience transistor degradation over time;
an integrated on-chip characterization circuit to determine a measure of transistor degradation in the transistors of the processor, the integrated on-chip characterization circuit including
at least one free-running ring oscillator to generate a free-running oscillating signal,
at least one selectively enabled ring oscillator to generate a reference oscillating signal, and
a comparison circuit coupled to the selectively enabled ring oscillator and the free-running ring oscillator, the comparison circuit to periodically determine the measure of transistor degradation in the transistors of the processor, the transistor degradation including at least one of p-channel metal oxide semiconductor field effect transistor bias temperature (PMOS BT) degradation and hot electron transistor degradation;
wherein the at least one selectively enabled ring oscillator and the at least one free-running ring oscillator are located in the same area of the integrated circuit.

20. The system of claim 19, wherein
the free-running ring oscillator and the selectively enabled ring oscillator have transistors with long channel lengths; and
the comparison circuit determines a combined measure of PMOS bias temperature transistor degradation.

21. The system of claim 19, wherein
the free-running ring oscillator and the selectively enabled ring oscillator have transistors with short channel lengths; and
the comparison circuit determines a measure of PMOS bias temperature and hot electron transistor degradation.

22. The system of claim 19, wherein
the free-running ring oscillator and the selectively enabled ring oscillator are substantially similar circuits;
the selectively enabled ring oscillator is selectively enabled to avoid transistor degradation; and
the free-running ring oscillator is continuously enabled to experience transistor degradation.

23. The system of claim 22, wherein the selectively enabled ring oscillator is selectively enabled by switching a power supply.

24. The system of claim 23, wherein the power supply being switched is VDD.

25. The system of claim 23, wherein the power supply being switched is ground.

26. An enabable ring oscillator comprising:
an odd number of p-channel field effect transistors (PFETs) each having a gate, a drain, and a source;
an odd number of n-channel field effect transistors (NFETs) each having a gate, a drain, and a source;
the odd number of PFETs and the odd number of NFETs coupled together to form a daisy chain series of inverters with a switchable power supply; and
wherein the drain of a last PFET of the odd number of PFETs and the drain of a last NFET of the odd number of NFETs coupled together to couple to gates of a first PFET of the add number of PFETs and first NFET of the odd number of NFETs;
wherein the enabable ring oscillator to provide a reference frequency to a comparison circuit for a measurement of at least one of p-channel metal oxide semiconductor field effect transistor bias temperature (PMOS BT) degradation and hot electron transistor degradation.

27. The enabable ring oscillator of claim 26, wherein an NFET having a source coupled to a negative power supply terminal, a drain coupled to the sources of the odd number of NFETs, a gate coupled to an enable signal, the NFET to provide the switchable power supply in response to the enable signal.

28. The enabable ring oscillator of claim 26, wherein an PFET having a source coupled to a positive power supply terminal, a drain coupled to the sources of the odd number of PFETs, the PFET to provide the switchable power supply.

29. The enabable ring oscillator of claim 26, wherein a first transfer gate coupled between the drains of the last PFET and the last NFET and the gates of the first PFET and the first NFET, the first transfer gate having a first control terminal coupled to a select signal; and a second transfer gate coupled between a data input signal and the gates of the first PFET and the first NFET, the second transfer gate having a second control terminal coupled to the select signal.

\* \* \* \* \*